United States Patent
Lee (10) Patent No.: US 7,678,619 B2
(45) Date of Patent: Mar. 16, 2010

(54) METHOD OF MANUFACTURING A THIN FILM TRANSISTOR MATRIX SUBSTRATE

(75) Inventor: Liu-Chung Lee, Neipu Township, Pingtung County (TW)

(73) Assignee: Au Optronics Corporation, Hsinchu (TW)

( * ) Notice: Subject to any disclaimer, the term of this patent is extended or adjusted under 35 U.S.C. 154(b) by 874 days.

(21) Appl. No.: 11/359,947

(22) Filed: Feb. 22, 2006

(65) Prior Publication Data

US 2007/0042537 A1  Feb. 22, 2007

(30) Foreign Application Priority Data

Aug. 17, 2005  (TW) ............... 94128098 A (51) Int. Cl.
*H01L 21/82* (2006.01)
(52) U.S. Cl. ............ 438/129; 438/151; 438/164; 438/587; 438/778
(58) Field of Classification Search ............ None
See application file for complete search history.

(56) References Cited

U.S. PATENT DOCUMENTS

| 6,274,400 | B1 | 8/2001 | Jen |
| 6,406,928 | B1 | 6/2002 | Jen et al. |
| 6,730,548 | B1 * | 5/2004 | Yang ............ 438/149 |
| 7,223,621 | B2 * | 5/2007 | Kim ............ 438/30 |
| 7,314,783 | B2 * | 1/2008 | Lee et al. ............ 438/149 |
| 7,427,540 | B2 * | 9/2008 | Liao ............ 438/151 |
| 2002/0130324 | A1 * | 9/2002 | Song et al. ............ 257/72 |
| 2009/0233390 | A1 * | 9/2009 | Yamazaki et al. ............ 438/29 |

FOREIGN PATENT DOCUMENTS

| JP | 2002-250934 | 9/2002 |
| JP | 2002-250935 | 9/2002 |
| JP | 2004-038130 | 2/2004 |
| JP | 2004-104134 | 4/2004 |
| TW | 437096 | 5/2001 |
| TW | 441133 | 6/2001 |

* cited by examiner

*Primary Examiner*—Alonzo Chambliss
(74) *Attorney, Agent, or Firm*—Thomas, Kayden, Horstemeyer & Risley (57) ABSTRACT

A method of manufacturing a thin film transistor matrix substrate is provided. The first photo-mask process is used to define a gate electrode and a signal electrode. The second photo-mask process is used to obtain different thickness of a PR layer in different regions for forming a channel, gate electrode through holes, signal electrode through holes and conductive pads. The third photo-mask process is used to define a source, a drain, an upper signal electrode, a pixel electrode, gate electrode pads and signal electrode pads.

14 Claims, 6 Drawing Sheets

METHOD OF MANUFACTURING A THIN FILM TRANSISTOR MATRIX SUBSTRATE

RELATED APPLICATIONS

The present application is based on, and claims priority from, Taiwan Application Serial Number 94128098, filed Aug. 17, 2005, the disclosure of which is hereby incorporated by reference herein in its entirety.

BACKGROUND OF THE INVENTION

1. Field of Invention

The invention relates to a method of manufacturing a liquid crystal display (LCD) panel and, in particular, to a method of manufacturing a thin film transistor matrix substrate.

2. Related Art

In recent years, opto-electronic related technologies have made tremendous progress. The digital era promotes the development of the LCD market. Since they have such advantages as high picture quality, small size, light weight, low driving voltages, and low power consumption, the LCD's have been widely used in personal digital assistants (PDA), mobile phones, camcorders, notebook computers, desktop displays, vehicle displays, and projection televisions. They have gradually replaced the traditional cathode ray tubes (CRT) as the mainstream of displays.

The LCD is a display device that utilizes liquid crystals to achieve display effects. Since it is better than the traditional CRT in size and weight, it is often used in various kinds of personal systems, from as small as mobile phones, PDA's, displays on digital cameras to as large as televisions and advertisement boards.

The reason that the LCD is better than the traditional CRT in size and weight is because most of the devices in the LCD are flat. After cutting these devices to appropriate sizes, it is thus possible to have light and flat LCD's.

It is well-known that photo masks are expensive. More photo masks mean a higher cost as well as longer manufacturing time. In addition to reducing the cost, reducing the number of photo masks also speed up the production and competitive power of the products. Therefore, the invention aims at reducing the number of photo masks required for making amorphous silicon LCD's and thus reducing the production cost and enhancing the competitive power of the products.

If transistors are processed using the inverted staggered back-channel protection method in the usual process of making thin film transistor matrix substrates, then the transistor channels are not damaged by etching and the devices keep their good properties. Also due to the inverted staggered back-channel protection, the film thickness of the semiconductor layer is reduced. This does not decrease the production of optical current, but also reduces the plasma damages during the film formation. Therefore, using the inverted staggered back-channel protection method to make transistor matrix substrates is the common practice in the field.

Figure 1:
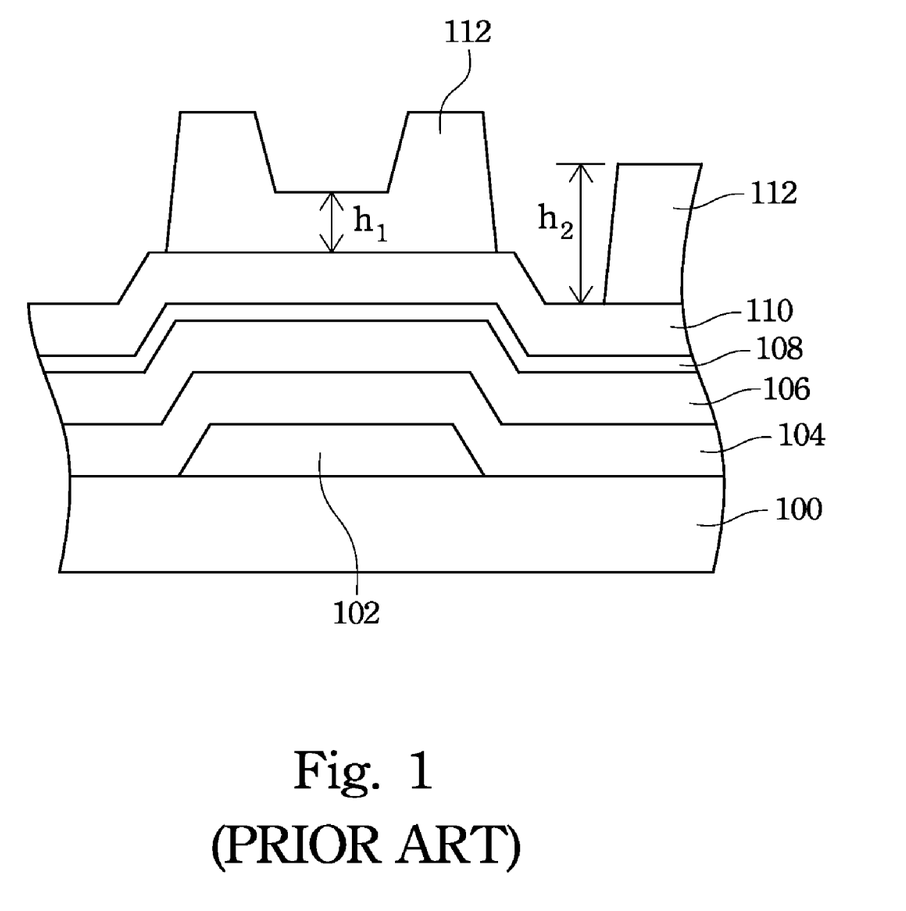
FIG. 1 is a schematic view showing the key steps in reducing the number of required photo masks in the prior art.

In the usual process of manufacturing thin film transistor matrix substrates, particularly the inverted staggered back-channel protection method, the number of required photo masks is reduced down to five or four. Take the four-photo-mask process as an example. The key steps of reducing the number of photo masks are shown in FIG. 1. A gate 102 is formed on the glass substrate 100, followed by the deposition of a dielectric layer 104, a semiconductor layer 106, an ohmic contact layer 108, and an electrode layer 110 in sequence. After coating a photo resist (PR) layer (not shown), a halftone photo mask is used to perform exposure and subsequent developing steps, forming a patternized PR layer 112. The patternized PR layer 112 is formed over the gate 102 in a concave shape in the region for forming source/drain and channels. Transistors are then formed using different etching methods. The PR layer 112 has a smaller thickness h1 at the location for the channel, while other part of the PR layer 112 has a thickness h2. The thickness h1 of the PR layer 112 has two different heights in the region for forming the source/drain and channel. This is the key to the entire process. Since each region has to have two different PR heights, both the taper angle and the PR thickness h1 on the channel region will affect subsequent etching. However, it is very difficult to control these two factors.

Therefore, how to reduce the number of required photo masks while retaining the yield is a problem.

SUMMARY OF THE INVENTION

In view of the foregoing, an aspect of the invention is to provide a method of manufacturing inverted staggered back-channel-protected thin film transistor matrix substrates. Only three photo masks are needed in order to complete the pixel electrode and driving transistor process.

Another aspect of the invention is to provide a method of manufacturing inverted staggered back-channel-protected thin film transistor matrix substrates. The products thus made are more competitive in price because the production cost is greatly reduced.

Yet another aspect is to provide a method of manufacturing inverted staggered back-channel-protected thin film transistor matrix substrates. The number of photo masks required for defining the source/drain is reduced.

A further aspect of the invention is to provide a method of manufacturing inverted staggered back-channel-protected thin film transistor matrix substrates. The halftone photo mask is employed to reduce the number of required photo masks. The disclosed method also avoids difficulty in controlling the thickness of the PR layer and the taper angle.

In accord with the above-mentioned aspects, a method of manufacturing inverted staggered back-channel-protected thin film transistor matrix substrates requires only three photo mask processes in order to complete the fabrication of pixel electrodes and driving transistors. The three photo mask processes are as follows. A first conductive wire layer, a gate, a signal electrode and a third conductive wire layer are defined in the first photo mask process, followed by deposition of a dielectric layer, a semiconductor layer, and a passivation layer. The gate is electrically connected to the first conductive wire layer. The third conductive wire layer can be a wire pad. A halftone photo mask is used in the second photo mask process. A halftone gray level exposure distribution is employed to expose and develop a PR layer, thereby defining a channel, gate electrode through holes, signal electrode through holes, and conductive pads with different thickness of the PR layer. In particular, the gate electrode through holes, the signal electrode through holes, and the conductive pads (e.g. signal wires) are regions where the PR is completely removed. The channel has the thickest PR layer. The other regions have a less thick PR layer. After using different etching methods (drying etching or wet etching) to complete the formation of the channel, contact holes, and the definition of pixel electrodes, then the PR layer is removed. The material of the dielectric layer and the passivation layer can be either silicon nitride or silicon oxide nitride. The material of the semiconductor layer can be either polysilicon or amorphous silicon. The dielectric layer is used as the gate dielectric layer.

Since it is disposed above the gate electrode, the dielectric layer, the channel on the dielectric layer, and the passivation layer on the channel form a channel island structure.

Afterwards, a conductive layer is deposited on all the device structure. An equipment which can perform anisotropic etching, such as a reactive ion etching (RIE), is employed to perform a self-alignment etching process, leaving the conductive layer on the sidewalls of the channel island structure. The conductive layer is used for making an ohmic contact layer. Afterwards, a transparent conductive layer is deposited. The third photo mask process is then used to define the source/drain, a second conductive wire layer, a pixel electrode, gate wire contact pads, and data wire contact pads. The second conductive wire layer is a transparent conductor signal electrode. The transparent conductor signal electrode is connected, using a through hole, in parallel with the signal electrode defined in the first photo mask process to reduce the resistance.

A conductive layer (e.g. a metal layer) may be further deposited on the transparent conductive layer. When defining the source/drain, the signal electrode, the pixel electrode, the gate wire contact pads, and data wire contact pads in the third photo mask process, a halftone photo mask is used. A halftone gray level exposure distribution is employed to expose the signal electrode, the pixel electrode, and other regions so that they have different thickness in the PR layer. In particular, the thickness of the PR layer on the signal electrode is the largest. The thickness of the PR layer on the pixel electrode is the second largest. The other regions do not have any PR layer left. One etching is used to remove the conductive layer and the transparent conductive layer that are not covered by the PR layer. Afterwards, the PR layer above the pixel electrode is removed, followed by another etching to remove the exposed conductive layer. Since the PR layer above the signal electrode has the largest height, the remaining PR layer is still sufficient to cover the signal electrode. Therefore, the conductive layer in this region still remains. Finally, the entire PR layer is removed, leaving the signal electrode composed of the conductive layer and the transparent conductive layer. Moreover, the resistance of the signal electrode is reduced.

Therefore, using the disclosed method to manufacture thin film transistor matrix substrates has the following advantages:

(1) The number of required photo masks in the processes is reduced.

(2) The method is applicable to manufacture inverted staggered back-channel-protected thin film transistor matrix substrates. Due to the inverted staggered back-channel protection, the devices keep their good properties because of no damages in the device channel regions during the etching process and the thickness of the semiconductor layer is also reduced. This does not only reduce the generation of an optical current, the plasma damages can be reduced during the film formation too.

(3) The production cost is reduced.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE INVENTION

The present invention will be apparent from the following detailed description, which proceeds with reference to the accompanying drawings, wherein the same references relate to the same elements.

Figure 2A:
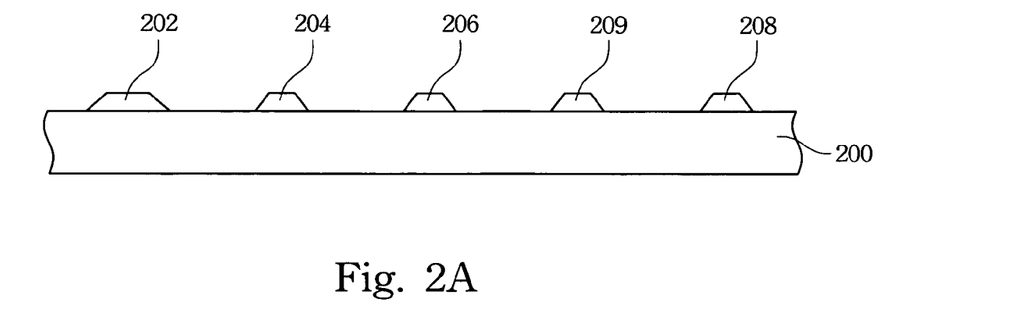
FIGS. 2A to 2F are schematic views showing the procedure of manufacturing an inverted staggered back-channel-protected transistor matrix substrate according to a preferred embodiment of the invention.

FIGS. 2A to 2F are schematic cross-sectional views of manufacturing an inverted staggered back-channel-protected thin film transistor matrix substrate according to a preferred embodiment of the invention. As shown in FIG. 2A, a conductive layer is defined on a transparent substrate 200 in a photo mask process, thereby forming a gate electrode 202, a lower electrode of a storage capacitor 204, a signal electrode 206, and a gate electrode pads 208, and signal electrode pads 209. The transparent substrate 200 is a glass substrate. The material of the conductive layer is Al, Mo, Cu, alloys thereof, and metal nitrides. The conductive layer may have a single-layer or a multi-layer structure formed from the above-mentioned materials.

Figure 2B:
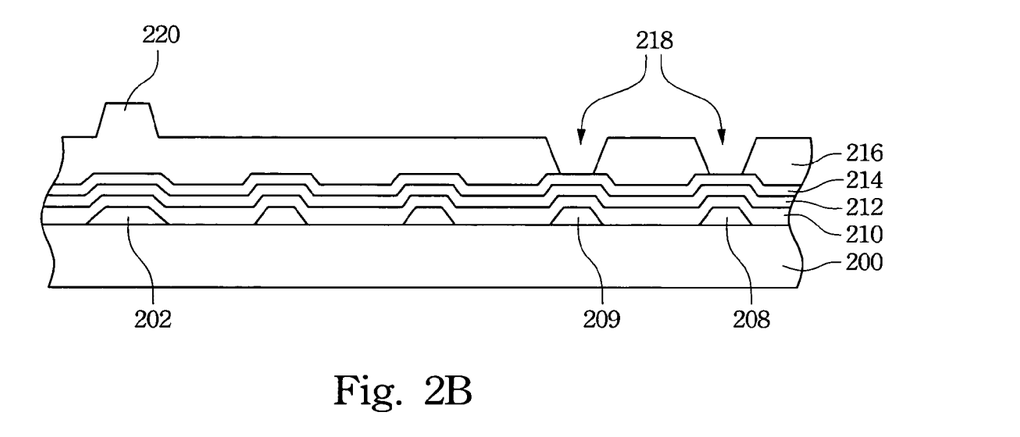

With reference to FIG. 2B, the transparent substrate 200 and the patternized conductive layer are deposited in sequence a gate dielectric layer 210, a semiconductor layer 212, and a passivation layer 214. The material of the gate dielectric layer 210 and the passivation layer 214 may be selected from silicon nitride, silicon oxide nitride, and silicon oxide. The material of the semiconductor layer 212 can be polysilicon or amorphous silicon. Besides, the passivation layer 214 is further formed with a PR layer 216 for halftone photo mask exposure. The PR layer has openings 218 above the gate electrode pads 208 and the signal electrode pads 209. There is a thicker PR structure 220 above the gate electrode 202.

Figure 2C:
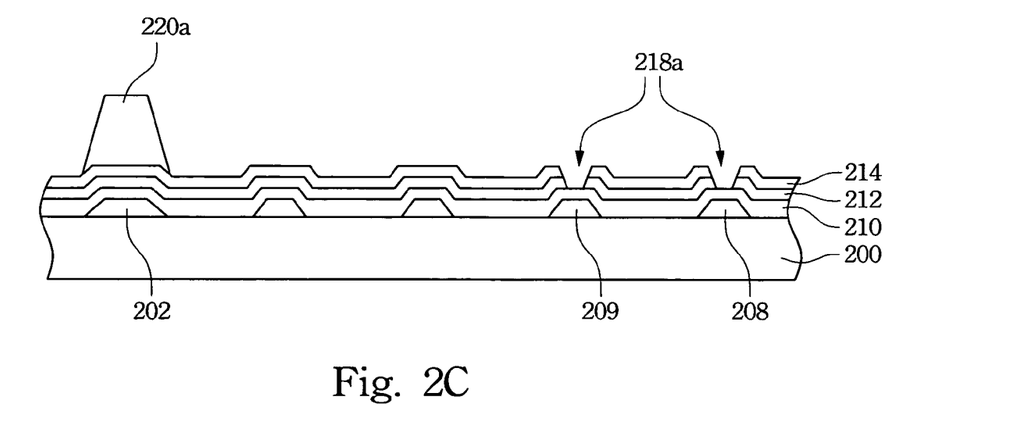

With reference to FIG. 2C, dry etching or wet etching is used to define channel, gate electrode through holes, signal electrode through holes, and wire (e.g. data lines, now shown in FIG. 2C) through holes and the pixel areas. The composition of the etchant used in etching process is determined by the materials to be etched. For example, this embodiment first uses $SF_6/O_2$ as the etchant to remove the passivation layer 214 and the semiconductor layer 212 exposed in the openings 218, forming the openings 218a shown in FIG. 2C. The openings 218a are the locations for forming the through holes for the gate electrode pads 208 and the signal electrode pad 209. Here the etching conditions are controlled so that the etching continues until the gate electrode pads 208 and the signal electrode pad 209 are exposed.

With further reference to FIG. 2C, $O_2$ is used as the etchant to remove the PR layer 216 in FIG. 2B. Since there is a thicker PR structure 220 above the gate electrode 202, the gate electrode 202 is still protected from above by the PR structure 220a when the PR in other regions is removed in this step. Afterwards, with the PR structure 220a as a mask, $SF_6/O_2$ and $SF_6/Cl_2$ are used as the etchant to remove the passivation layer 214, the semiconductor layer 212, and the gate dielectric layer 210 above the gate electrode pad 208 and the signal electrode pad 209 in FIG. 2C. Finally, the PR structure 220a is removed to form the structure shown in FIG. 2D.

Figure 2D:
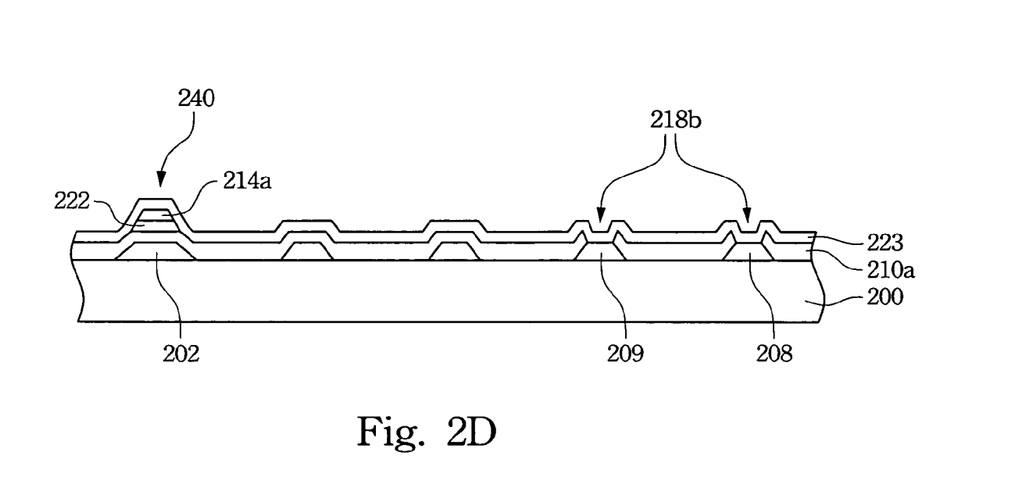

As shown in FIG. 2D, the transparent substrate 200 is formed with a gate dielectric layer 210a, which has openings 218b above the gate electrode pad 208 and the signal electrode pad 209. The openings 218b expose the upper surfaces of the gate electrode pad 208 and the signal electrode pad 209. The openings 218b are through holes. The gate dielectric layer 210a above the gate electrode 202 is a conformal structure. The channel 222 and the passivation layer 214a are above the gate electrode 202. The protruding gate dielectric layer 210a, the channel 222 thereon, and the passivation layer 214a on the channel 222 form a channel island structure 240. Afterwards, a conformal conductive layer 223 is formed above the transparent substrate 200. The material of the conductive layer 223 can be amorphous silicon, polysilicon, metal silicate, or metal.

Figure 2E:
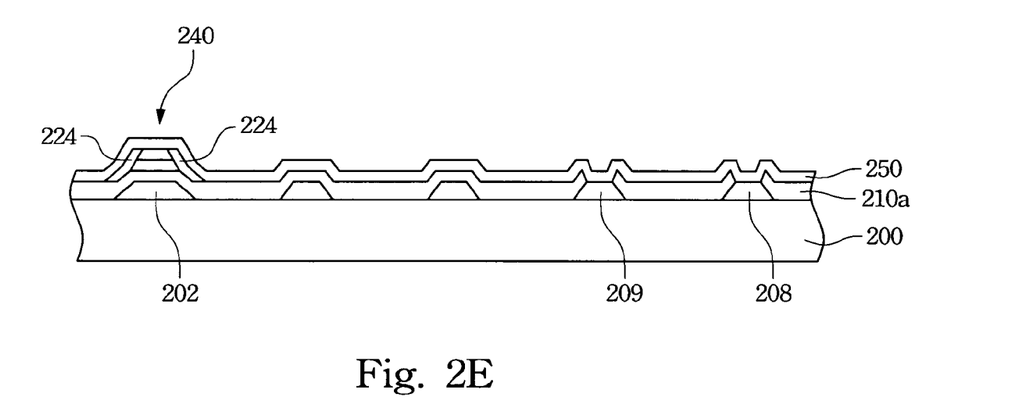

As shown in FIG. 2E, an isotropic etching process is used to remove the conductive layer 223, forming spacers 224 on the sidewalls of the channel island structure 240. The spacer 224 is used as the ohmic contact layer for subsequent forming the source/drain electrodes thereon. Finally, the conformal transparent conductive layer 250 is formed on the transparent substrate 200. The material of the transparent conductive layer 250 can be In—Sn oxides, In—Zn oxides, Al—Zn oxides, indium oxide, or tin oxide. A PR layer (not shown) is formed on the transparent conductive layer 250. A photo mask process is used to perform lithography and etching processes on the transparent conductive layer in FIG. 2E, forming the structure shown in FIG. 2F. In this embodiment, the spacer 224 is used as an ohmic contact layer. In other embodiments of the invention, the method of forming the ohmic contact layers can be achieved by plasma doping on the sidewalls of the channel. In either way, there is no need of an additional photo mask process.

Figure 2F:
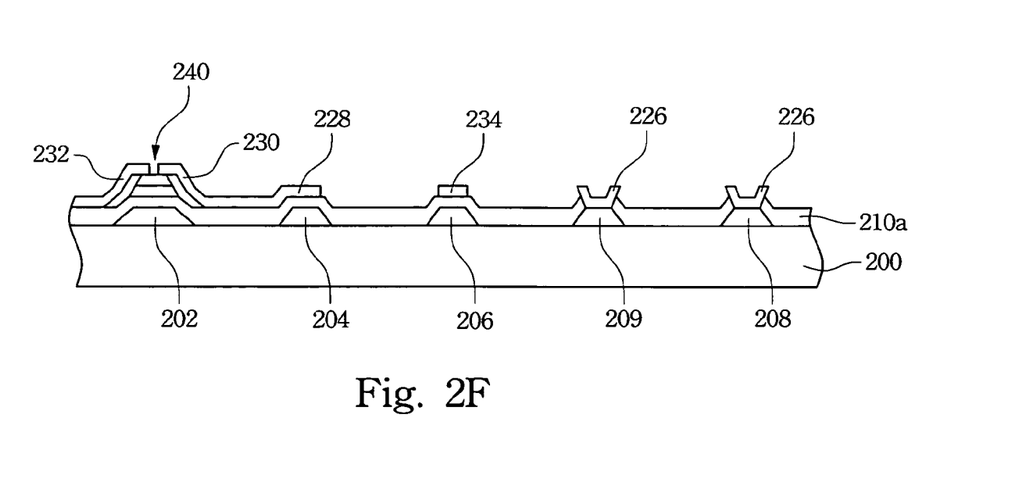

With reference to FIG. 2F, a third photo mask and a lithographic etching process are employed to define the transparent conductive layer 250, forming the source/drain electrodes 230, 232 on the spacers 224. Besides, the pixel electrode 228 and the upper layer signal electrode 234 are also defined. The overlapping part between the pixel electrode 228 and the lower electrode of a storage capacitor 204 can be used as an upper electrode of a storage capacitor, forming a storage capacitor. The upper layer signal electrode 234 is electrically coupled to the signal electrode pad 209 (not shown) via the contact 226 formed in the openings 218b on the signal electrode pad 209. Using such a design can reduce the impedance for signal transmissions on the signal electrode.

Figure 2G:
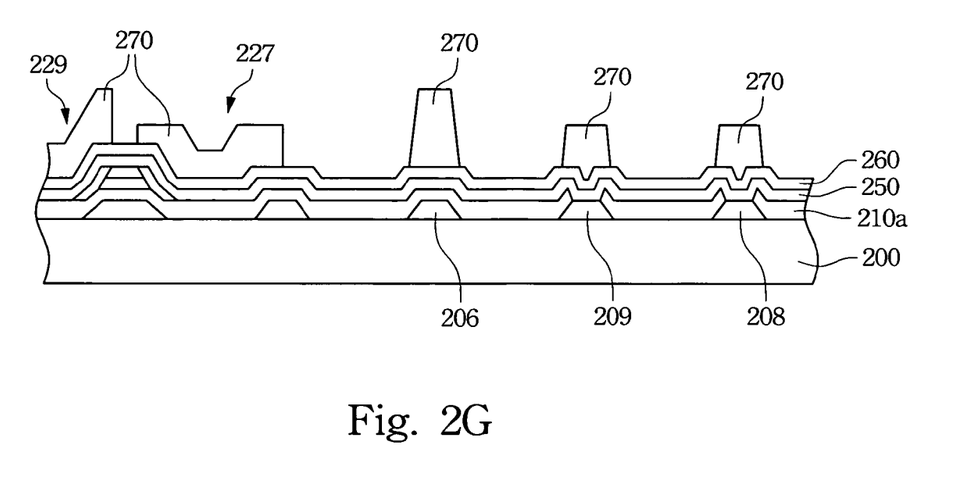
FIGS. 2G to 2H are schematic views of another embodiment for FIG. 2E.

With reference to FIG. 2G, a conductive layer 260 made of Al, Mo, Cu, alloys thereof, and metal nitrides can be formed on the structure of FIG. 2E. On the conductive layer 260, a halftone photo mask is used to expose and develop a PR layer in a halftone gray level exposure distribution. A PR layer 270 with varying heights is thus formed on the signal electrode 206 in the regions 229 for forming the source/drain electrodes, the region 227 for forming the pixel electrode, the signal electrode pad 209, and the gate electrode pad 208. The PR layer 270 has the largest height at regions above the signal electrode 206 and the source/drain electrodes 229. The PR layer 270 has the second largest height at regions above the pixel electrode 227, the signal electrode pad 209, and the gate electrode pad 208. The other regions are not covered by the PR layer.

Using a first etching removes the conductive layer 260 and the transparent conductive layer 250 that are not covered by the PR layer 270. Afterwards, the PR layer 270 above the pixel electrode 227, the signal electrode pad 209, and the gate electrode pad 208 is removed, followed by an etching process to remove the exposed conductive layer 260. Since the PR layer 270 has the largest height on the signal electrode 206 and the source/drain electrodes 232, the remaining PR layer 270 is still sufficient to cover the signal electrode 206 and the source/drain electrodes 232, keeping the conductive layer 260 in this region. Finally, the entire PR layer is removed to form the structure shown in FIG. 2H, including the upper signal electrode 234 composed of the conductive layer 260 and the transparent conductive layer 250. The impedance of the upper layer signal electrode 234 is thus reduced.

Figure 2H:
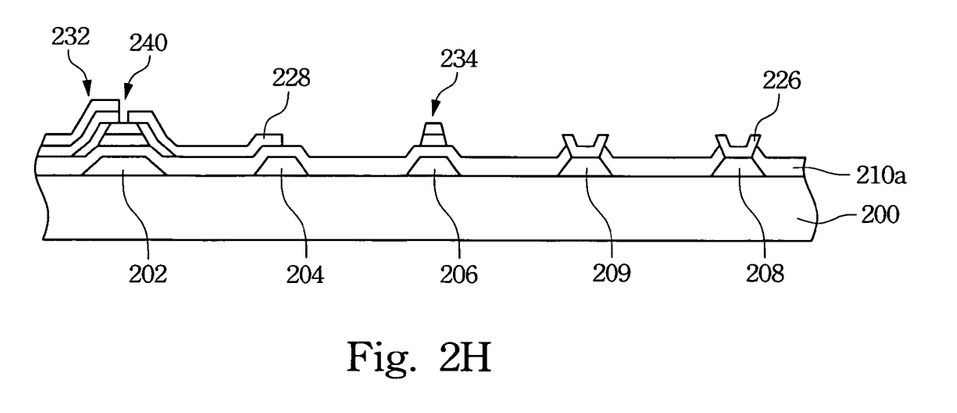
Figure 2I:
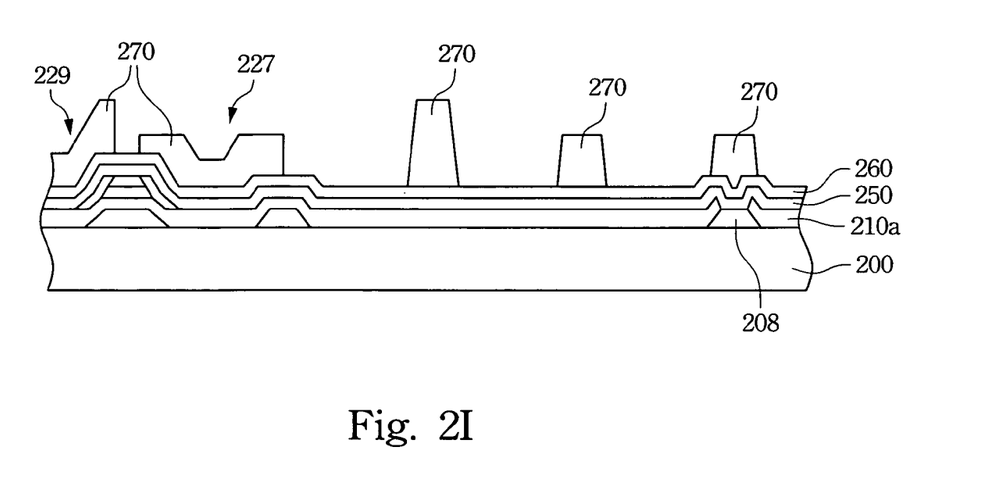
FIGS. 2I to 2J are schematic views showing the procedure of manufacturing an inverted staggered back-channel-protected transistor matrix substrate according to another embodiment of the invention.
Figure 2J:
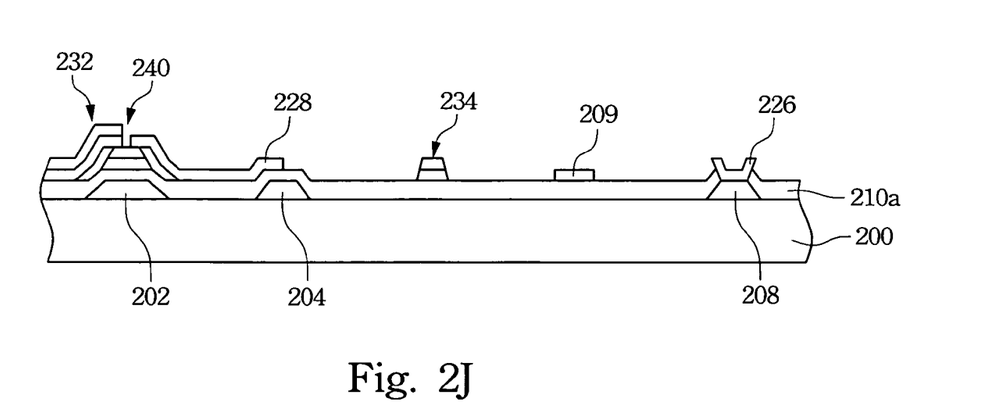

FIGS. 2I and 2J show another embodiment of the method of manufacturing the inverted staggered back-channel-protected transistor matrix substrate. The structure of FIG. 2I is formed by using the method described in FIGS. 2A through 2E. The difference from the previous embodiment is in that one photo mask process is used to define a conductive layer to form the gate electrode 202, the lower electrode of a storage capacitor 204, and the gate electrode pad 208, without forming the signal electrode 206 and the signal electrode pad 209. Since the first photo mask process does not form the signal electrode pad 209, the subsequent second photo mask process only forms an opening above the gate electrode pad 208.

After forming the spacers 224 as the ohmic contacts of the source/drain electrodes in FIGS. 2D to 2E, conformal transparent conductive layer 250 and conductive layer 260 are formed in sequence on the transparent substrate 200. The materials of the transparent conductive layer 250 and the conductive layer 260 are the same as described in the previous embodiment.

Afterwards, a halftone photo mask is used on the conductive layer 260. A halftone gray level exposure distribution is employed to form a PR layer 270 with varying heights on the locations for forming the signal electrode 234, the regions for forming the source/drain electrodes 229, the region for forming pixel electrodes 227, the locations for forming the signal electrode pads 209, and on the gate electrode pads 208. The PR layer 270 has the largest height on the locations for forming the signal electrodes 234 and above the source/drain electrode regions 229. The PR layer 270 has the second largest height above the pixel electrode regions 227 and the locations for forming the signal electrode pads 209, and on the gate electrode pads 208. There is no PR layer in the other regions.

A first etching is used to remove the conductive layer 260 and the transparent conductive layer 250 that are not covered by the PR layer 270, defining the signal electrode 234, the signal electrode pad 209, and the pixel electrode 227. After removing the PR layer 270 above the pixel electrode 227, the signal electrode pad 209, and the gate electrode pad 208, an etching process is used to remove the exposed conductive layer 260. Since the regions above the signal electrode 234 and the source/drain electrodes 232 has the thickest PR layer 270, the remaining PR layer 270 is still sufficient to cover the signal electrode 234 and the source/drain electrodes 232, keeping the conductive layer 260 in these regions. Finally, the entire PR layer is removed, forming the structure shown in FIG. 2J. It includes the upper layer signal electrode 234 composed of the conductive layer 260 and the transparent conductive layer 250, thereby lowering the impedance of the upper layer signal electrode 234.

Figure 3A:
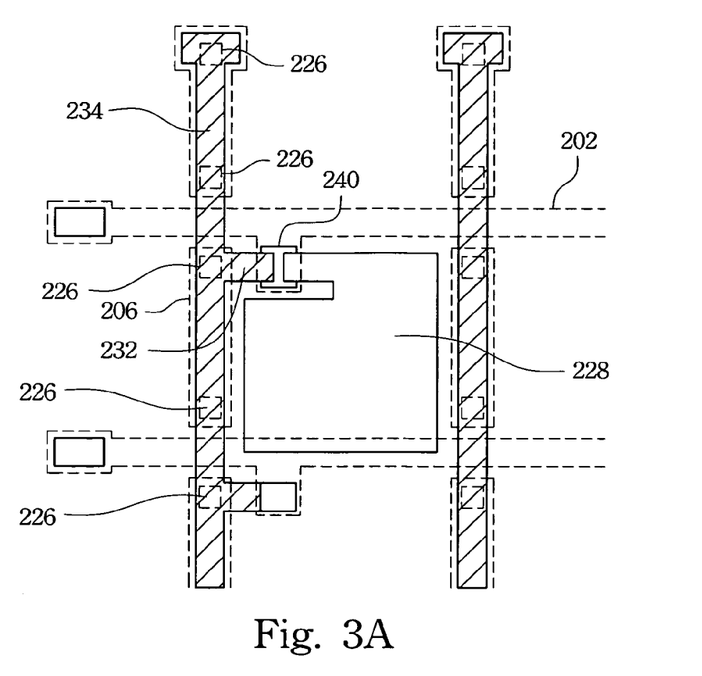
FIG. 3A is a top view of FIG. 2F or FIG. 2H.

FIG. 3A is a top view of FIG. 2F or FIG. 2H. The dashed lines indicate the signal electrode 206 and the gate electrode 202 under the gate dielectric layer (not shown). The upper layer signal electrode 234 is electrically coupled to the signal electrode pad (not shown) via the contact 226 and the signal electrode 206.

Figure 3B:
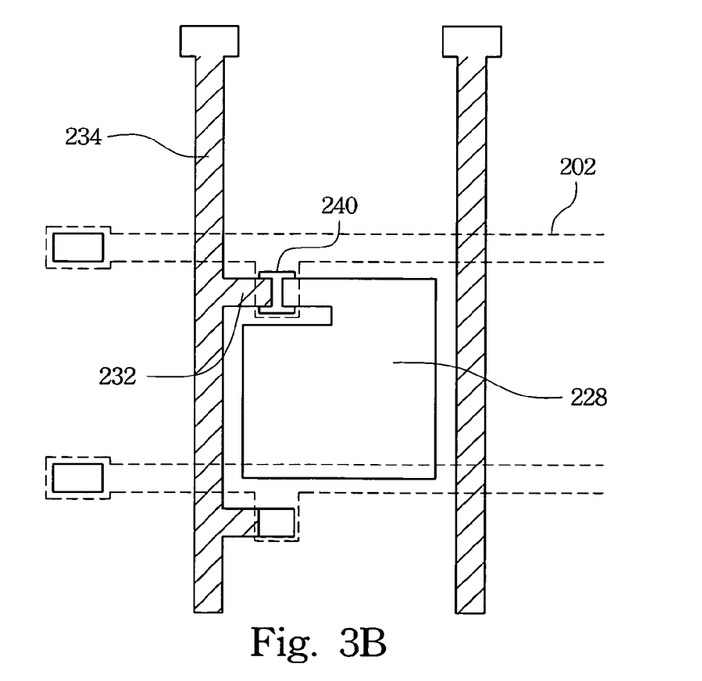
FIG. 3B is a top view of FIG. 2J.

FIG. 3B is a top view of FIG. 2J. In the drawing, the signal electrode 206 under the gate dielectric layer in FIG. 2F or FIG. 2H can be omitted, using only the upper signal electrode 234. There is no signal electrode under the upper layer signal electrode 234 and the gate dielectric layer. The upper layer signal electrode 234 is formed by continuous deposition of the transparent conductive layer 250 and the conductive layer 260, followed by removing the conductive layer above the signal electrode pads, so that the signal electrode pad regions are covered by the transparent conductive layer only. Consequently, there is no need to first form the signal electrode pads when patterning the first conductive layer.

As described in the above-mentioned embodiment, the invention only needs three photo masks in the process of manufacturing pixel electrodes and driving transistors. In comparison with the prior art, at least one photo mask is saved. Besides, the use of the halftone photo mask avoids the difficulty in controlling the thickness and taper angle of the PR layer. Therefore, the disclosed method of manufacturing thin film transistor matrix substrates can indeed reduce the number of required photo masks, promote the device properties, and lower the production cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing thin film transistors, comprising:
    forming a first conductive layer on a transparent substrate;
    patterning the first conductive layer to form at least a gate electrode and at least a first conductive wire layer, so that the gate electrode and the first conductive wire layer are electrically connected;
    sequentially depositing a first dielectric layer, a semiconductor layer, and a second dielectric layer to cover the transparent substrate, the gate electrode, and the first conductive wire layer;
    forming a photoresist layer on the second dielectric layer;
    patterning the photoresist layer by a photomask, so that the photoresist layer on the second dielectric layer above the gate electrode is thicker than that above the transparent substrate, and the second dielectric layer above the first conductive wire layer is exposed;
    removing a part of the photoresist layer, the second dielectric layer and the semiconductor layer so that a first opening is formed in the second dielectric layer and the semiconductor layer to expose the first dielectric layer on the first conductive wire layer, and the photoresist layer having a reduced thickness is formed on the second dielectric layer above the gate electrode;
    removing a part of the photoresist layer, a part of the second dielectric layer, a part of the semiconductor layer and a part of the first dielectric layer so that a stack, which is composed of a passivation layer and a channel region above the gate electrode, is formed above the gate electrode, and a second opening in the first dielectric layer is formed to expose the first conductive wire layer, wherein the passivation layer is formed by the second dielectric layer and the channel region is formed by the semiconductor layer;
    forming ohmic contact layers on sidewalls of the stack above the gate electrode;
    forming a transparent conductive layer to cover the first conductive wire layer, the ohmic contact layer, and the first dielectric layer; and
    patterning the transparent conductive layer to define a source/drain on both sides of the channel region, a pixel electrode, and a second conductive wire layer, wherein one of the source/drain is electrically connected to the pixel electrode.

2. The method of claim 1, wherein the photomask is a gray tone photomask.

3. The method of claim 1, wherein patterning the first conductive layer comprises forming a third conductive wire layer electrically isolated from the first conductive wire layer.

4. The method of claim 2, wherein the third conducive wire layer and the second conductive wire layer are electrically connected via the second opening.

5. The method of claim 1, wherein the semiconductor layer is amorphous silicon, polysilicon, or a combination thereof.

6. The method of claim 1, wherein part of the pixel electrode and the first conductive wire layer overlap to form a storage capacitor.

7. The method of claim 1, wherein the ohmic contact layer is doped amorphous silicon, doped polysilicon, or a combination thereof.

8. A method for manufacturing thin film transistors, comprising:
    forming a first conductive layer on a transparent substrate;
    patterning the first conductive layer to form at least a gate electrode and at least a first conductive wire layer, so that the gate electrode and the first conductive wire layer are electrically connected;
    sequentially depositing a first dielectric layer, a semiconductor layer, and a second dielectric layer to cover the transparent substrate, the gate electrode, and the first conductive wire layer;
    forming a photoresist layer on the second dielectric layer;
    applying a photomask to expose and develop the photoresist layer, so that the photoresist layer on the second dielectric layer above the gate electrode is thicker than that above the transparent substrate, and the second dielectric layer above the first conductive wire layer is exposed;
    removing a part of the photoresist layer, a part of the second dielectric layer and a part of the semiconductor layer so that a first opening is formed in the second dielectric layer and the semiconductor layer to expose the first dielectric layer on the first conductive wire layer, and the photoresist layer having a reduced thickness is formed on the second dielectric layer above the gate electrode;
    removing a part of the photoresist layer, a part of the second dielectric layer, a part of the semiconductor layer and a part of the first dielectric layer so that a stack, which is composed of a passivation layer and a channel region above the gate electrode, is formed above the gate electrode, and a second opening in the first dielectric layer is formed to expose the first conductive wire layer, wherein the passivation layer is formed by the second dielectric layer and the channel region is formed by the semiconductor layer;
    forming an ohmic contact layer on sidewalls of the stack above the gate electrode;
    sequentially forming a transparent conductive layer and a second conductive layer to cover the first conductive wire layer, the ohmic contact layer, and the first dielectric layer; and patterning the transparent conductive layer and the second conductive layer to define source/drain on both sides of the ohmic contact layer, a pixel electrode, and a second conductive wire layer, wherein one of the source/drain is electrically connected to the pixel electrode.

9. The method of claim 8, wherein patterning the first conductive layer comprises forming a third conductive wire layer electrically isolated from the first conductive wire layer.

10. The method of claim 9, wherein the third conducive wire layer and the second conductive wire layer are electrically connected via the second opening.

11. The method of claim 8, wherein the semiconductor layer is amorphous silicon, polysilicon, or a combination thereof.

12. The method of claim 8, wherein the photomask is a gray tone photomask.

13. The method of claim 8, wherein part of the pixel electrode and the first conductive wire layer overlap to form a storage capacitor.

14. The method of claim 8, wherein the ohmic contact layer is doped amorphous silicon, doped polysilicon, or a combination thereof.

* * * * *